United States Patent
Fukuda et al.

(10) Patent No.: US 7,903,071 B2
(45) Date of Patent: *Mar. 8, 2011

(54) DRIVER IC FOR DISPLAY AND DISPLAY INCLUDING SAME

(75) Inventors: Hideto Fukuda, Kasugai (JP); Shinya Udo, Kasugai (JP); Masao Kumagai, Kasugai (JP); Osamu Kudo, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 837 days.

This patent is subject to a terminal disclaimer.

(21) Appl. No.: 11/890,585

(22) Filed: Aug. 6, 2007

(65) Prior Publication Data

US 2007/0296679 A1    Dec. 27, 2007

Related U.S. Application Data

(62) Division of application No. 10/701,856, filed on Nov. 5, 2003, now Pat. No. 7,268,763.

(30) Foreign Application Priority Data

Nov. 8, 2002    (JP) .................................. 2002-325743

(51) Int. Cl.
    *G09G 3/36*    (2006.01)
(52) U.S. Cl. ................................ 345/98; 345/89; 345/94
(58) Field of Classification Search ............. 345/87–90, 345/92–100, 204, 208–214, 690

See application file for complete search history.

(56) References Cited

U.S. PATENT DOCUMENTS

| | | |
|---|---|---|
| 2001/0028336 A1 | 10/2001 | Yamagata et al. |
| 2002/0008686 A1 | 1/2002 | Kumada et al. |
| 2003/0034947 A1 | 2/2003 | Tanaka et al. |
| 2005/0225573 A1 | 10/2005 | Kudo et al. |

FOREIGN PATENT DOCUMENTS

| | | |
|---|---|---|
| JP | 62-24713 | 2/1987 |
| JP | 9-138670 | 5/1997 |
| JP | 9-258695 | 10/1997 |
| JP | 2001-290123 | 10/2001 |

*Primary Examiner* — Henry N Tran
*Assistant Examiner* — Mansour M Said
(74) *Attorney, Agent, or Firm* — Greer, Burns & Crain, Ltd.

(57) ABSTRACT

A driver IC for a display that includes a first D/A converter with a $1^{st}$ selection circuit that receives $1^{st}$ image signals and supplies a selected positive divisional voltage to a $1^{st}$ operational amplifier, which supplies a positive pixel voltage by amplifying the selected positive divisional voltage; a $2^{nd}$ D/A converter with a $2^{nd}$ selection circuit that receives $2^{nd}$ image signals and supplies a selected negative divisional voltage to a $2^{nd}$ operational amplifier, which supplies a negative pixel voltage by amplifying the selected negative divisional voltage; and a polarity switching switch with $1^{st}$ and $2^{nd}$ switches connecting the $1^{st}$ and $2^{nd}$ D/A converters respectively, the polarity switching switch being switched to supply each of output terminals corresponding to the $1^{st}$ and $2^{nd}$ image signals alternately with the positive and negative pixel voltages every horizontal scan period by activating/inactivating the $1^{st}$ and $2^{nd}$ switches in a complementary manner.

15 Claims, 12 Drawing Sheets

| CODE | D2 | D1 | D0 | SW1 | SW2 | SW3 | SW4 | SW5 |
|---|---|---|---|---|---|---|---|---|
| m | 0 | 0 | 0 | OFF | ON | OFF | OFF | ON |
| m+1 | 0 | 0 | 1 | ON | ON | OFF | OFF | ON |
| m+2 | 0 | 1 | 0 | ON | ON | OFF | ON | OFF |
| m+3 | 0 | 1 | 1 | ON | ON | ON | OFF | OFF |
| m+4 | 1 | 0 | 0 | OFF | ON | ON | OFF | OFF |
| m+5 | 1 | 0 | 1 | ON | ON | ON | OFF | OFF |
| m+6 | 1 | 1 | 0 | ON | ON | OFF | ON | OFF |
| m+7 | 1 | 1 | 1 | ON | ON | OFF | OFF | ON |
| m+8 | 0 | 0 | 0 | OFF | ON | OFF | OFF | ON |
| m+9 | 0 | 0 | 1 | ON | ON | OFF | OFF | ON |
| m+10 | 0 | 1 | 0 | ON | ON | OFF | ON | OFF |
| m+11 | 0 | 1 | 1 | ON | ON | ON | OFF | OFF |
| m+12 | 1 | 0 | 0 | OFF | ON | ON | OFF | OFF |
| m+13 | 1 | 0 | 1 | ON | ON | ON | OFF | OFF |
| m+14 | 1 | 1 | 0 | ON | ON | OFF | ON | OFF |
| m+15 | 1 | 1 | 1 | ON | ON | OFF | OFF | ON |
| m+16 | 1 | 0 | 0 | OFF | ON | OFF | OFF | ON |
| ⋮ | 1 | 0 | 1 | ON | ON | OFF | OFF | ON |
| ⋮ | 1 | 1 | 0 | ON | ON | OFF | ON | OFF |
| ⋮ | ⋮ | ⋮ | ⋮ | ⋮ | ⋮ | ⋮ | ⋮ | ⋮ |

DRIVER IC FOR DISPLAY AND DISPLAY INCLUDING SAME

CROSS-REFERENCE TO RELATED APPLICATIONS

This is a divisional of application Ser. No. 10/701,856, filed Nov. 5, 2003, now U.S. Pat. No. 7,268,763 which is based upon and claims the benefit of priority from the prior Japanese Patent Application No. 2002-325743, filed on Nov. 8, 2002, the entire contents of which are incorporated herein by reference.

BACKGROUND OF THE INVENTION

The present invention relates to a method for driving a display and a drive circuit for a display.

An electronic device, such as a notebook type personal computer, employs a liquid crystal display, which is provided with a multiple gray scale display function. A driver IC, which drives the display, includes a gray scale selection circuit for selecting a gray scale voltage in accordance with an image signal. The gray scale selection circuit includes a multiplicity of gates and occupies a large portion of the driver IC. Thus, to reduce the size of the driver IC, it is required that the number of gates in the gray scale selection circuit be decreased.

In the liquid crystal display of the prior art, the pixel voltage applied to each pixel cell of a liquid crystal display panel (LCD panel) is controlled to realize a multiple gray scale display. FIG. 1 is a schematic diagram showing a prior art example of a driver IC 1 for driving an LCD panel.

A logic section 2, which serves as a controller, is arranged in the middle of the driver IC 1. A data latch circuit 3, a gray scale selection circuit 4, and an operational amplifier 5 are configured on each of the left and right sides of the logic section 2. The gray scale selection circuit 4 includes a plurality of gates and occupies about thirty percent of the entire chip. For example, in a driver IC that drives eight bit data lines with 256 gray scales, a driver IC having 480 outputs would have to have a total of 983,040 gates on the entire chip.

FIG. 2 is a schematic diagram of the gray scale selection circuit 4 in the prior art. The gray scale selection circuit 4 is connected to a series-connected circuit 2a, which includes ladder resistors R, and receives a divisional voltage generated by the ladder resistors R. The ladder resistors R divide a reference voltage into, for example, 256. In other words, the divisional voltages generated by the ladder resistors R correspond to 256 gray scales. Further, referring to FIG. 1, the series-connected circuit 2a of the ladder resistors R is arranged in the logic section 2. A plurality of gray scale lines 6 connect the series-connected circuit 2a and the gray scale selection circuit 4.

As shown in FIG. 2, the gray scale selection circuit 4 includes a plurality of switch circuits 7. One end of each switch circuit 7 is connected to a connection node between ladder resistors R (voltage dividing node). The other end of each switch circuit 7 is connected to an input terminal of an operational amplifier 8. In accordance with input signals D0 to D7, which are generated for eight bits, one of the switch circuits 7 is activated. This outputs the desired divisional voltage from the operational amplifier 8 in accordance with the input signals D0 to D7.

With reference to FIG. 3, each switch circuit 7 has a plurality of (eight) series-connected switches 9 corresponding to the input signals D7 to D0. As shown in FIG. 4(a), each switch 9 is a transfer gate, which is configured by an n-channel MOS transistor and a p-channel MOS transistor and which is activated and inactivated by complementary signals D and /D (D0 to D7, and D0/ to D7/). Each switch may be a gate configured only by an n-channel MOS transistor, as shown in FIG. 4(b), or a gate configured only by a p-channel MOS transistor, as shown in FIG. 4(c)

The gray scale selection circuit 4 requires a plurality of switches (gates) 9. This enlarges the chip area. Accordingly, proposals have been made to decrease the number of gates used in the gray scale selection circuit 4 to reduce the chip area (e.g., Japanese Laid-Open Patent Publication No. 9-138670 and Japanese Laid-Open Patent Publication No. 9-258695). More specifically, the publications each describe a voltage dividing circuit, which generates a divisional voltage, into two stages to decrease the number of gray scale voltage selection switches and reduce the chip area.

However, in the technology described in the publications, a buffer for performing impedance conversion is inserted between the first stage of the divisional circuit and the second stage of the divisional circuit. The buffer that is used is an operational amplifier. The employment of the operational amplifier is disadvantageous in that the circuit area increases and the manufacturing cost increases. Further, the operational amplifier has an offset value that produces an output error. Thus, when increasing the gray scales, the potential difference between gray scale voltages decreases and high accuracy becomes necessary. Thus, the application of the above prior art technology is difficult.

SUMMARY OF THE INVENTION

One aspect of the present invention is a method for generating pixel voltage to drive a display. The method includes generating a plurality of divisional voltages by dividing a predetermined reference voltage, and selecting one of the divisional voltages by selectively activating at least one of a plurality of first switch circuits with a selection signal. Each of the first switch circuits has an ON resistance when activated. The method further includes generating the pixel voltage by further dividing the selected one of the divisional voltages with at least the ON resistance of the activated one of the first switch circuits.

A further aspect of the present invention is a drive circuit for a display. The drive circuit includes a first voltage dividing circuit for generating a plurality of divisional voltages by dividing a predetermined reference voltage. A selection circuit is connected to the first voltage dividing circuit to receive a selection signal and select one of the divisional voltages. The selection circuit includes a plurality of first switch circuits that are selectively activated in response to the selection signal to select one of the divisional voltages, with each of the first switch circuits being provided with a logic switch function and having an ON resistance when activated, and at least an activated one of the first switch circuits generating a pixel voltage for supply to the display by further dividing the selected one of the divisional voltages.

A further aspect of the present invention is a D/A converter for receiving a plurality of divisional voltages and converting a digital signal to an analog voltage with the divisional voltages. The D/A converter includes a selection circuit for receiving the divisional voltages and the digital signal to select one of the divisional voltages. The selection circuit includes a plurality of first switch circuits that are selectively activated in response to the digital signal to select one of the divisional voltages, with each of the first switch circuits being provided with a logic switch function and having an ON resistance when activated, and at least an activated one of the first switch circuits further dividing the selected one of the divisional voltages with the ON resistance.

A further aspect of the present invention is a method for generating a predetermined voltage with a digital signal. The method includes generating a plurality of divisional voltages by dividing a predetermined reference voltage, and selecting one of the divisional voltages by selectively activating at least one of a plurality of first switch circuits with the digital signal. Each of the first switch circuits has an ON resistance when activated. The method further includes generating the predetermined voltage by further dividing the selected one of the divisional voltages with at least the ON resistance of the activated one of the first switch circuits.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 10 is a decoding chart used by the short switch of FIG. 9;

DETAILED DESCRIPTION OF THE PREFERRED EMBODIMENTS

Figure 1:
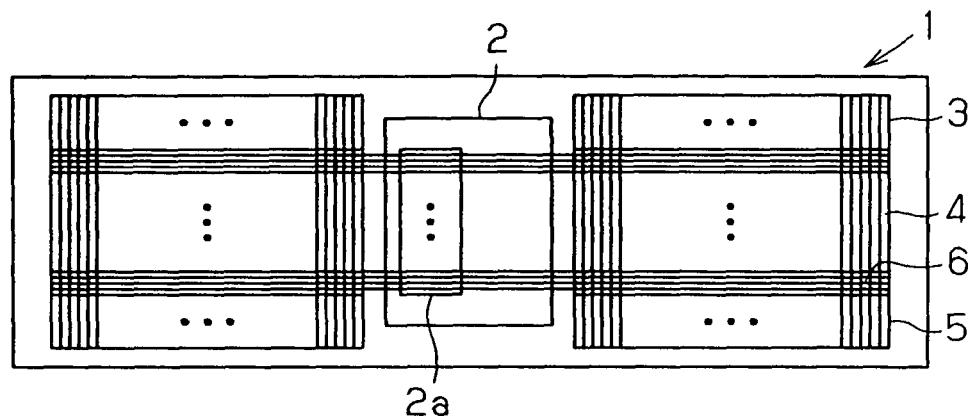
FIG. 1 is a schematic diagram of a driver IC in the prior art.

In the drawings, like numerals are used for like elements throughout.

Figure 5:
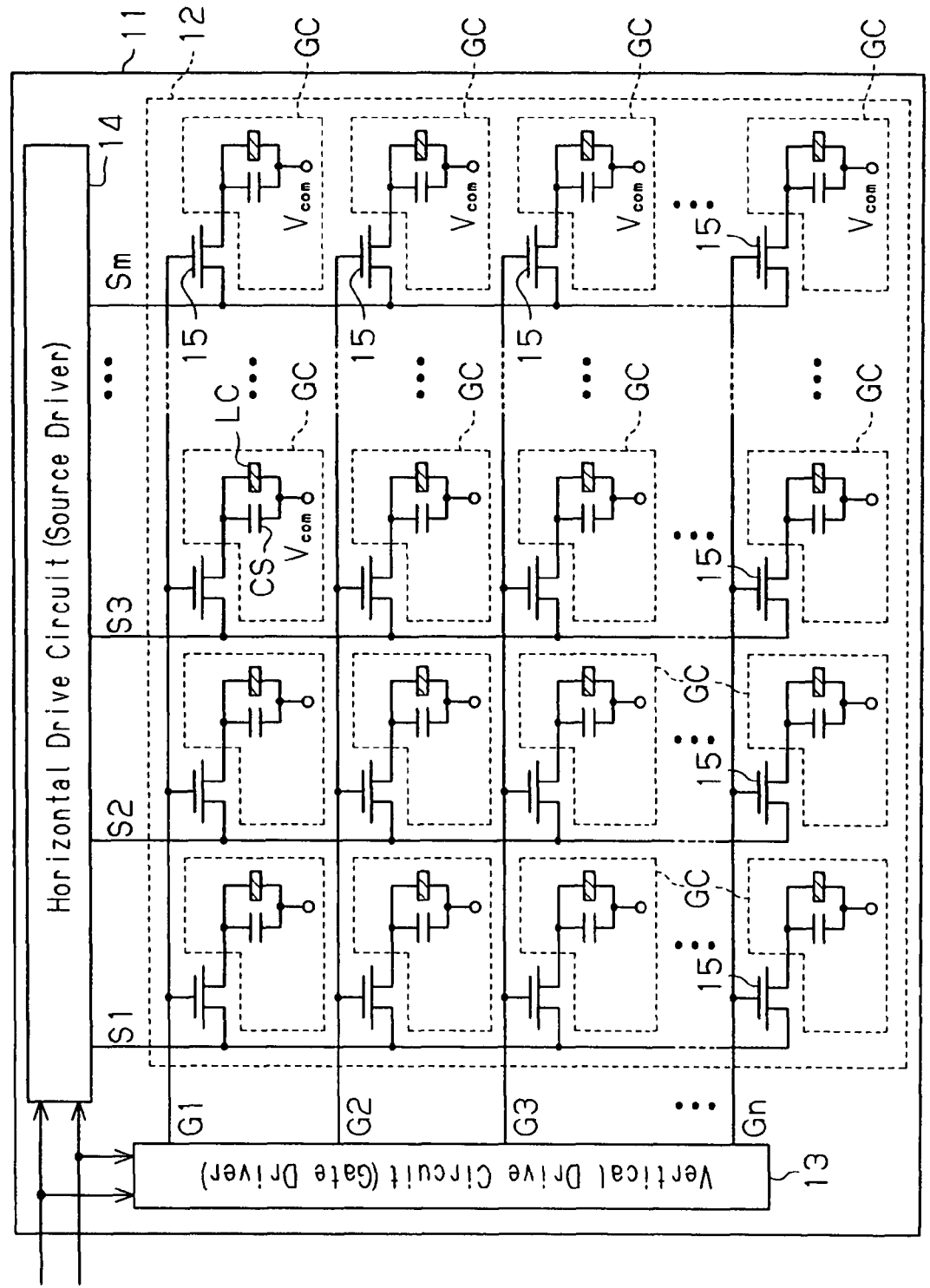
FIG. 5 is a schematic block circuit diagram of a liquid crystal display including a driver IC according to a first embodiment of the present invention.

FIG. 5 is a schematic block circuit diagram of the liquid crystal display 11. The liquid crystal display 11 includes a liquid crystal display panel (LCD panel) 12, a vertical drive circuit (gate driver) 13, and a horizontal drive circuit (source driver) 14. The LCD panel includes a plurality of scan lines (gate lines) G1 to Gn and a plurality of data lines (source lines) S1 to Sm. The scan lines G1 to Gn are perpendicular to the data lines S1 to Sm. The letters n and m are integers.

A pixel cell GC is arranged at each intersection of the scan lines G1 to Gn and the data lines S1 to Sm. Each pixel cell GC includes an auxiliary (storage) capacitor CS, which is a signal storage device, and a liquid crystal cell LC. A thin film transistor (TFT) 15 connects each pixel cell GC to the corresponding scan lines G1 to Gn and the data lines S1 to Sm.

Each of the scan lines G1 to Gn is connected to the gate of the corresponding one of the TFTs 15. Each of the data lines S1 to Sm is connected to the source of the corresponding one of the TFTs 15. The drain of each TFT 15 is connected to a first electrode (display electrode) of the corresponding liquid crystal cell LC. A common voltage Vcom is applied to a second electrode (common electrode) of the liquid crystal cell LC. The liquid crystal cell LC is connected in parallel to the corresponding one of the auxiliary capacitances CS.

The scan lines G1 to Gn are connected to the gate driver 13, which receives a control signal. In accordance with the control signal, the gate driver 13 generates a scan signal (gate signal) and sequentially applies the scan signal to the scan lines G1 to Gn.

The data lines S1 to Sm are connected to the source driver 14. The source driver 14 receives the control signal and an image signal. In accordance with the control signal and the image signal, the source driver 14 generates segment voltage (pixel voltage) and supplies each of the data lines S1 to S3 with the segment voltage.

In accordance with the control signal, the gate driver 13 and the source driver 14 respectively perform vertical scanning and horizontal scanning. In this manner, the display 11 shows an image, which is based on the control signal and the image signal, on the liquid crystal panel 12.

Figure 6:
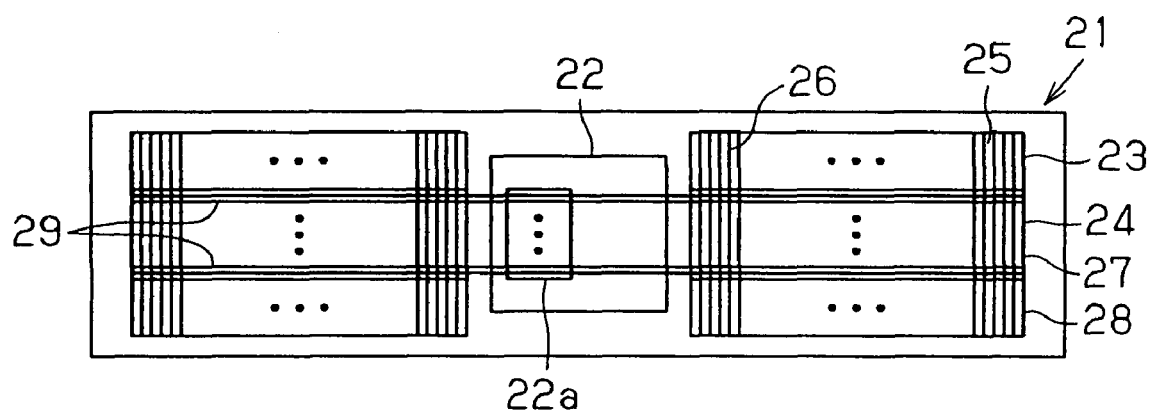
FIG. 6 is a schematic diagram of the driver IC according to the first embodiment of the present invention.

FIG. 6 is a schematic diagram illustrating a driver IC 21 according to a first embodiment of the present invention. The source driver 14 includes one or more driver ICs 21. The IC driver of the first embodiment is a semiconductor device that achieves, for example, a 256 gray scale display.

A logic section 22, which functions as a controller, is configured at the middle of the driver IC 21. A digital section 23 and an analog section 24 are configured at each of the left and right sides of the logic section 22. Each digital section 23 includes a plurality of data latch circuits 25 and level shifters 26. Each analog section 24 includes a plurality of gray scale selection circuits 27 and operational amplifiers 28.

The driver IC 21 includes ladder resistor type D/A converters. Each D/A converter is configured by a set of one of the gray scale selection circuits 27 and one of the operational amplifiers 28 in each analog section 24. The D/A converter is used to supply the pixel cell GC with a segment voltage corresponding to an image signal. More specifically, the logic section 22 includes a series-connected circuit 22a of ladder resistors. A plurality of gray scale lines 29 connect the ladder resistor series-connected circuit 22a and the gray scale selection circuits 27. The divisional voltages generated by the ladder resistors are supplied to the gray scale selection circuits 27 through the gray scale lines 29. The desired pixel voltage is output from the gray scale selection circuits 27 via the operational amplifiers 28.

Figure 7:
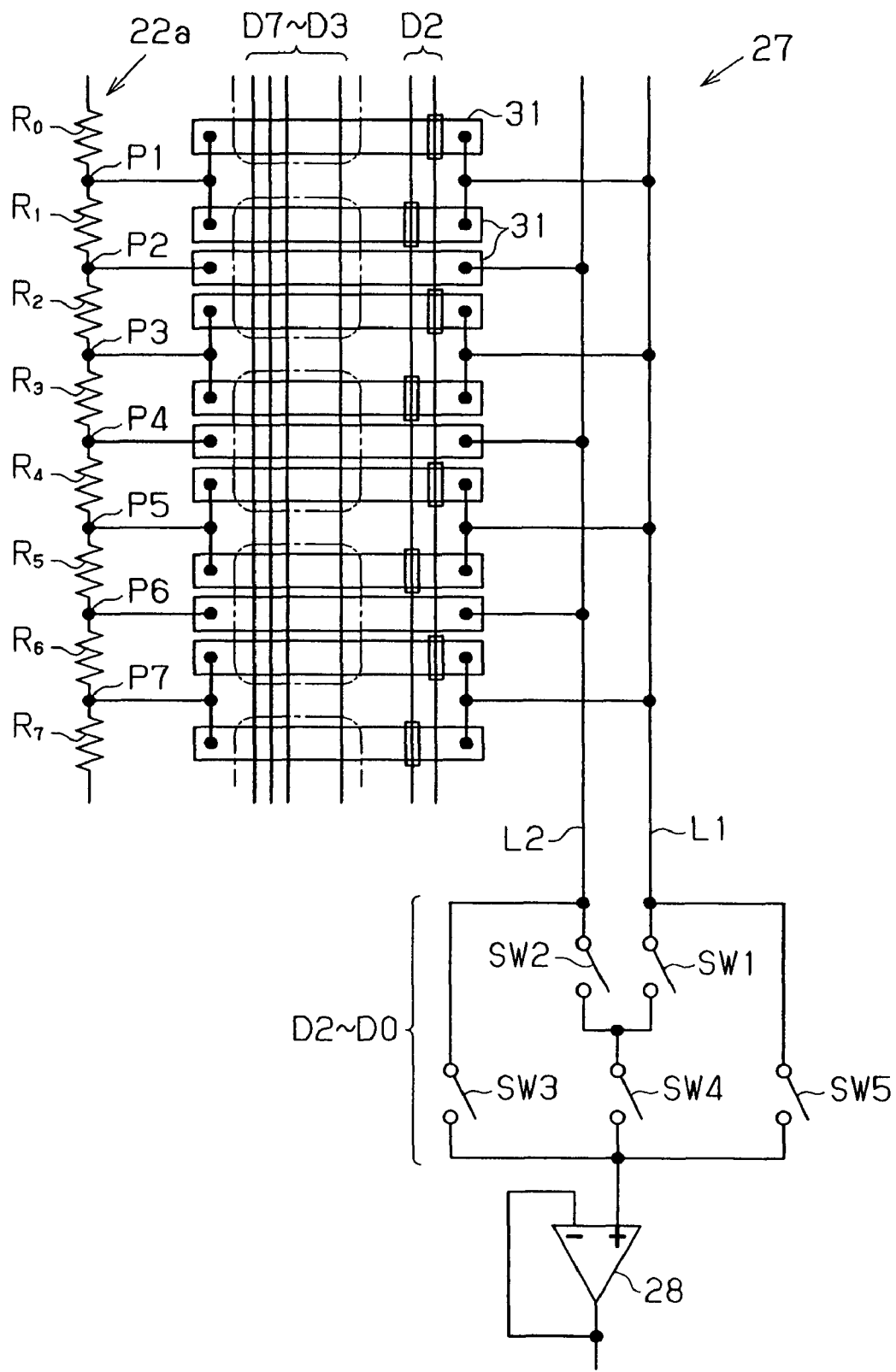
FIG. 7 is a schematic circuit diagram of a gray scale selection circuit incorporated in the driver IC of FIG. 6.

FIG. 7 is a schematic diagram illustrating a gray scale selection circuit 27 of the first embodiment. As shown in FIG. 7, the gray scale selection circuit 27 includes a plurality of switch circuits 31 and first to fifth short switches SW1 to SW5. Each switch circuit 31 is activated and inactivated in accordance with input signals D7 to D2. The short switches SW1 to SW5 are activated and inactivated in accordance with the input signals D2 to D0. Each of the input signals D7 to D0 is an eight bit image signal provided from the data latch circuit 25. The input signals D7 to D0 control the selection operation of the gray scale selection circuit 27.

In the first embodiment, each divisional voltage of the ladder resistors R0 to R7 corresponds to 64 gray scales and has a voltage value obtained by selecting every four of 256 gray scales. The switch circuits 31 and the short switches (voltage dividing switches) SW1 and SW2 divide the divisional voltages of the 64 gray scales to generate the voltages of 256 gray scales. The voltages of the 256 gray scales are provided to the corresponding operation amplifier 28 through one of the short switches SW3 to SW5.

Among connection nodes (voltage dividing nodes) P1 to P7 of the ladder resistors R0 to R7, the odd numbered voltage dividing nodes P1, P3, P5, and P7 are each connected to a first line L1 by a switch circuit 31. The even numbered voltage dividing nodes P2, P4, and P6 are each connected to a second line L2 by a switch circuit 31.

The first line L1 is connected to the first short switch SW1, and the second line L2 is connected to the second short switch SW2. The short switches SW1 and SW2 are connected to each other. A connection node of the short switches SW1 and SW2 is connected to the non-inverting input terminal of the operational amplifier 28 by the fourth short switch SW4. Further, the first line L1 is connected to the non inverting terminal of the operational amplifier 28 by the fifth short switch SW5. The second line L2 is connected to the non-inverting input terminal of the operational amplifier 28 via the third short switch SW3.

Figure 4:
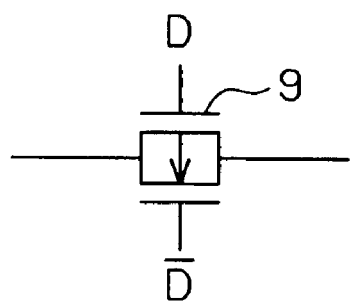
FIG. 4 is a diagram illustrating a switch incorporated in the switch circuit of FIG. 3.
Figure 4:
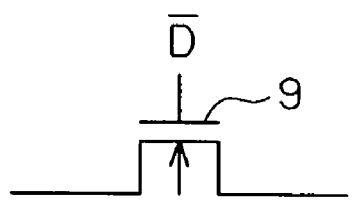
Figure 4:
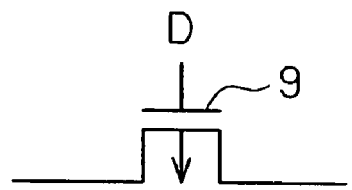
Figure 8:
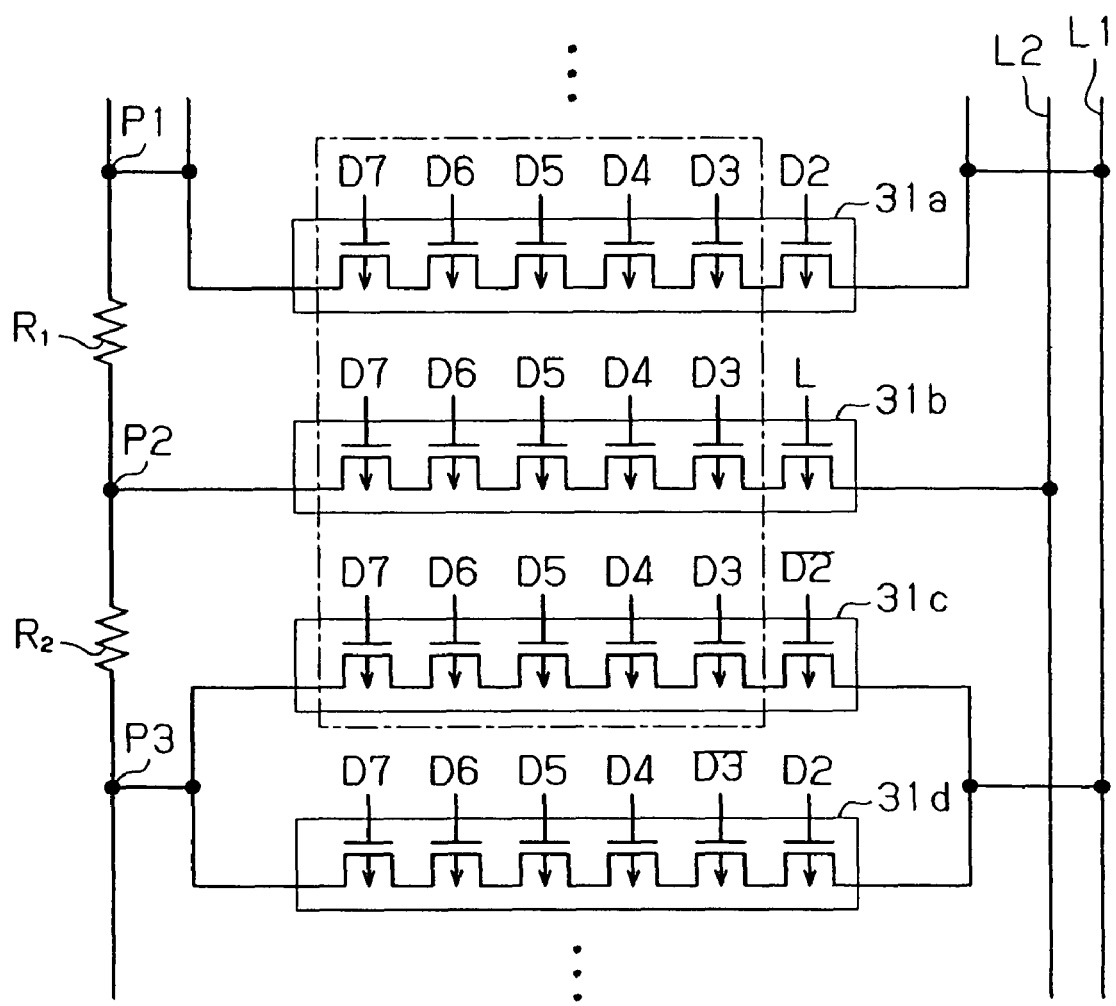
FIG. 8 is a circuit diagram of a switch circuit incorporated in the gray scale selection circuit of FIG. 7.

As shown in FIG. 8, the switch circuits 31 (31a to 31d) include six p-channel MOS transistors, which are connected in series to each other. The p-channel MOS transistor may be an n-channel MOS transistor or the transfer gate of FIG. 4(a).

In the switch circuit 31a, the signals D7, D6, D5, D4, D3, and D2 are sequentially provided to the gate of each transistor from the left as viewed in FIG. 8. In the switch circuit 31b, the signals D7, D6, D5, D4, and D3 and a signal having a low level are provided to the gate of each transistor. In the switch circuit 31c, the signals D7, D6, D5, D4, D3, D2/ are provided to the gate of each transistor. In the switch circuit 31d, the signals D7, D6, D5, D4, D3/, and D2 are provided to the gate of each transistor.

Accordingly, the transistors included in the area surrounded by the broken lines are activated by the signals D7 to D3. If the switch circuit 31b connected to the voltage dividing node P2 is activated when the signals D7 to D3 are low, the switch circuit 31a is activated when the signal D2 is low. In this state, the voltage at the voltage dividing node P2 is transmitted to the first line L1 through the switch circuit 31a, and the voltage at the voltage dividing node P2 is transmitted to the second line L2 through the switch circuit 31b. From this state, when the signal D2 goes high, the switch circuit 31a is inactivated and the switch circuit 31c is activated. This transmits the voltage at the voltage dividing node P3 to the first line L1 through the switch circuit 31b.

In this manner, in the gray scale selection circuit 27 of FIG. 7, one of the resistors R0 to R7 is selected in accordance with the input signals D7 to D2 to activate the two switch circuits 31 connected to the selected resistor. When the first and second short switches SW1 and SW2 are activated, the series-connected circuit that is configured by the switch circuit 31 and the first short switch SW1 and the series-connected circuit that is configured by the short switch SW2 and the switch circuit 31 are connected in parallel to the selected resistor. In this case, the ON resistance of the switch circuits 31 and the switches SW1 and SW2 divide the voltages at the two ends of the selected resistor. In other words, the switch circuit 31 and the series-connected circuit consisting of the short switches SW1 and SW2 function as a voltage dividing circuit.

Thus, the voltage at the first line L1, the voltage at the second line L2, and the voltage at the connection node of the switches SW1 and SW2 has a median voltage value with respect to the divisional voltage of the ladder resistors. When any one of the short switches SW3 to SW5 is activated, the operational amplifier 28 is supplied with the corresponding voltage (i.e., the voltage corresponding to the 256 gray scales). In other words, the activation and inactivation of the short switches SW1 to SW5 are controlled to output the voltages of the 256 gray scales with the operational amplifier 28.

Figure 9:
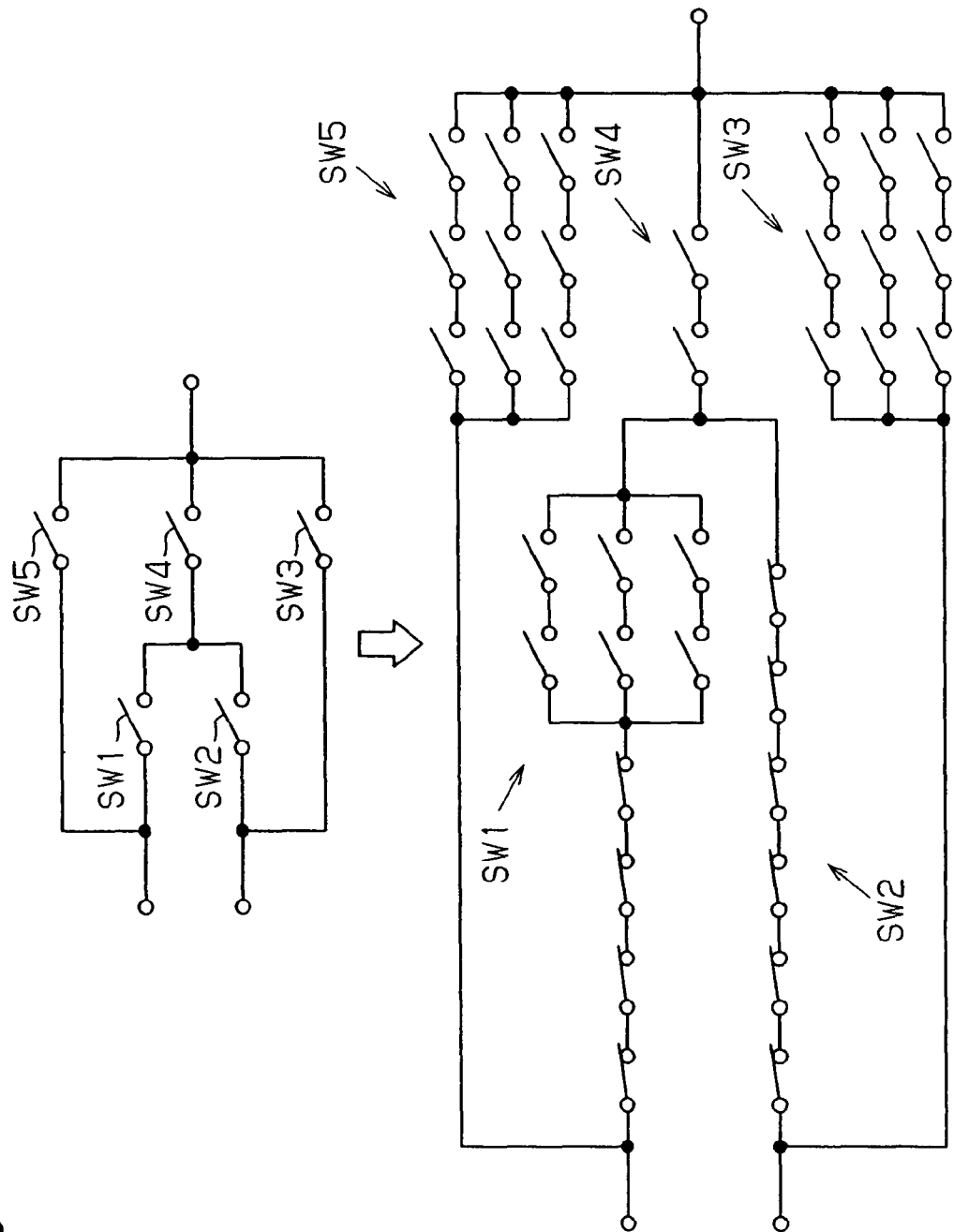
FIG. 9 is a schematic circuit diagram of a short switch incorporated in the gray scale selection circuit of FIG. 7.

FIG. 9 shows an example of the short switches SW1 to SW5 in detail. To perform switching operations (refer to FIG. 10) in accordance with the input signals D2 to D0, each of the short switches SW1 to SW5 is configured by a plurality of switching devices (e.g., p-channel MOS transistors). When the short switches SW1 and SW2 are activated, six MOS transistors are connected in series to equalize the ON resistance of the short switches SW1 and SW2 with the ON resistance of the switch circuit 31.

Figure 11:
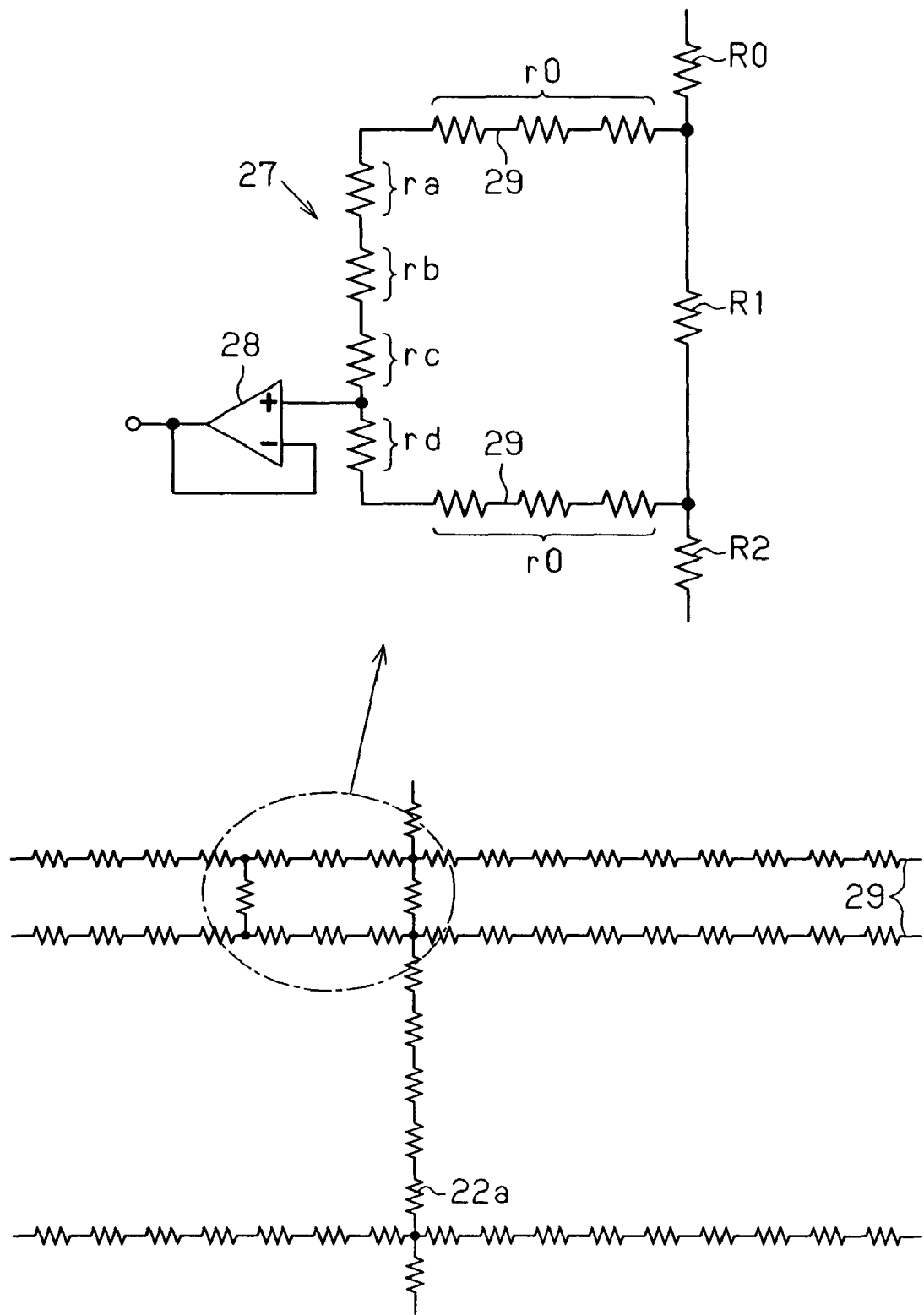
FIG. 11 is a diagram illustrating resistors of a gray scale line in the driver IC of FIG. 6.

Referring to FIG. 11, in the first embodiment, the gray scale lines 29 connected to the gray scale selection circuit 27 extend laterally. Line resistors ro of the gray scale line 29 serves as the offset component of the divisional circuit and influences the divisional voltage. The influence of the line resistors ro is greater at gray scale selection circuits 27 located farther from the chip center (i.e., the series-connected circuit 22a of ladder resistors). For example, with respect to ON resistors ra to rd of the voltage dividing circuit, when the divisional voltage between the ON resistor rd and the ON resistor rc is selected, the divisional voltage generated by the ON resistor rd and the and the line resistor ro is output from the gray scale selection circuit 27. In other words, in the voltage dividing circuit of the gray scale selection circuit 27, the divisional voltage of the ladder resistor R1 is divided into four by the resistors ra and ro, the resistor rb, the resistor rc, and the resistors rd and ro.

Therefore, in the first embodiment, the ON resistors rb and rc are adjusted based on the assumed increase in the resistance of the line resistor ro. In other words, each gray scale selection circuit 27 near the chip center is configured to have an ON resistance that is the same as the values it is designed to have. Each gray scale selection circuit 27 (ON resistor rb and rc) separated from the chip center is configured to have an ON resistance that increases in accordance with the distance from the chip center. This suppresses the influence of the resistors of the gray scale line 29.

Figure 12:
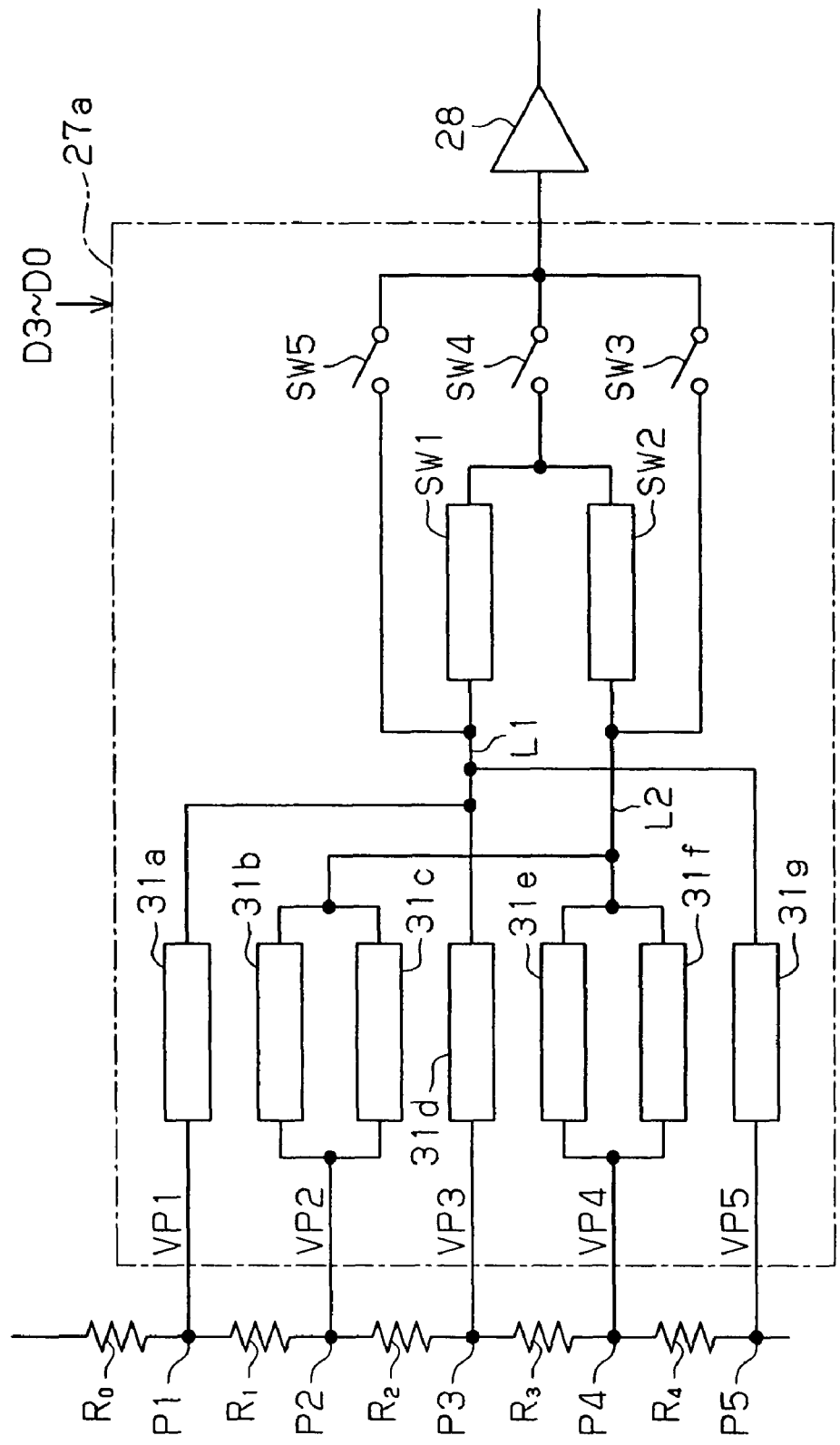
FIG. 12 is a schematic block circuit diagram illustrating an example of the gray scale selection circuit.

The operation of the gray scale selection circuit 27 in the first embodiment will now be discussed with reference to FIG. 12. FIG. 12 is a schematic block circuit diagram of a gray scale selection circuit 27a for 16 gray scales. In the gray scale selection circuit 27a, switch circuits 31a to 31g are activated and inactivated in accordance with the input signals D3 and D2. The switches SW1 to SW5 are activated and inactivated in accordance with the input signals D2 to D0 (refer to FIG. 10).

An example in which the gray scale selection circuit 27a selects the voltage Vp1 at the voltage dividing node P1 will now be discussed. In such a case, the input signals D3 and D2 activate the switch circuits 31a and 31b to transmit the voltage Vp1 at the voltage dividing node P1 to the first line L1 and transmit the voltage Vp2 at the voltage dividing node P2 to the second line L2.

The input signals (D2=0, D1=0, and D0=0) inactivate the switch SW1, activate the switch SW2, inactivate the switch SW3, inactivate the switch SW4, and activate the switch SW5 (refer to FIG. 10). This supplies the voltage Vp1 at the voltage dividing node P1 to the operational amplifier 28 via the switch circuit 31a, the first line L1, and the switch SW5. As a result, the voltage Vp1 is output from the operational amplifier 28.

Next, an example in which a median voltage between the voltage Vp1 at the voltage dividing node P1 and the voltage Vp2 at the voltage dividing node P2 will now be discussed. In this case, the input signals (D2=0, D1=0, and D0=1) activate the switch SW1, activate the switch SW2, inactivate the switch SW3, inactivate the switch SW4, and activate the switch SW5 (refer to FIG. 10). The activation of the switches SW1 and SW2 connects the resistor R1 parallel to the series-connected circuit configured by the switch circuit 31a, the switch SW1, the switch SW2, and the switch circuit 31b. The series-connected circuit functions as a voltage dividing circuit for generating the median voltage of the voltages Vp1 and Vp2 at the voltage dividing nodes P1 and P2. The voltage at the connection node between the switch circuit 31a and the switch SW1 is supplied to the operational amplifier 28 via the switch SW5. In the first embodiment, the ON resistances of the switch circuits 31a and 31b and the switches SW1 and SW2 are set, for example, so that they are substantially equal to one another. Accordingly, the input voltage of the operational amplifier 28 (the gray scale voltage selected by the selection circuit 27) has a value obtained by adding ¾ of the potential difference between the voltage Vp1 and the voltage Vp2 to the voltage Vp2.

When the input signals (D2=0, D1=1, and D0=0) activate the switches SW1 and SW2, inactivate the switches SW3 and SW5, and activate the switch SW4 (refer to FIG. 10), the voltage at the connection node between the switch SW2 and the switch SW1 is supplied to the operational amplifier 28 via the switch SW4. In this case, the input voltage of the operational amplifier 28 has a value obtained by adding ½ of the potential difference between the voltage Vp1 and the voltage Vp2 to the voltage Vp2.

When the input signals (D2=0, D1=1, and D0=1) activate the switches SW1 and SW2, activate the switch SW3, and inactivate the switches SW4 and SW5 (refer to FIG. 10), the voltage at the connection node between the switch SW2 and the switch circuit 31b is input to the operational amplifier 28 via the switch SW3. In this case, the input voltage of the operational amplifier 28 has a value obtained by adding ¼ of the potential difference between the voltage Vp1 and the voltage Vp2 to the voltage Vp2.

When the gray scale selection circuit 27 selects the voltage Vp2 of the voltage dividing node P2, the input signals D3 and D2 activate the switch circuits 31c and 31d. The input signals (D2=1, D1=0, and D0=0) inactivate the switch SW1, activate the switch SW2, activate the switch SW3, inactivate the switch SW4, and inactivate the switch SW5 (refer to FIG. 10). In this case, the voltage Vp2 at the voltage dividing node P2 is supplied to the operational amplifier 28 via the switch circuit 31c, the second line L2, and the switch SW3, and the voltage Vp2 is output from the operational amplifier 28.

When the median voltage between the voltage Vp2 at the voltage dividing node P2 and the voltage Vp3 at the voltage dividing node P3 is selected, the input signals D2 to D0 activate the switches SW1 and SW2. This configures a voltage dividing circuit with the switch circuit 31c, the switch SW2, the switch SW1, and the switch circuit 31d. When one of the switches SW3 to SW5 is activated, the median voltage between the voltage Vp2 and the voltage Vp3 is selected to supply the selected median voltage from the gray scale selection circuit 27a to the operational amplifier 28.

When selecting the other voltages Vp3, Vp4, and Vp5 or the median voltage of these voltages, the switch circuits 31a to 31f and the switches SW1 to SW5 are activated and inactivated in accordance with the input signals D3 to D0 to select the input voltage of the operational amplifier 28.

The operation of the gray scale selection circuit 27 is checked when testing the driver IC 21. More specifically, the selection of 64 gray scales with the activation and inactivation of the switch circuit and the selection of 16 gray scales with the activation and inactivation of the short switches SW1 to SW5 are checked. That is, the testing of the driver IC 21 with regard to the gray scale output ends after checking the selection of the 80 gray scales.

The driver IC 21 of the first embodiment has the advantages described below.

(1) The input signals D7 to D0 activate and inactivate the switch circuit 31 and the short switches SW1 to SW5 in the gray scale selection circuit 27 to select one of the divisional voltages. In this case, the ON resistance of the short switches SW1 and SW2 further divides the divisional voltage generated by the ladder resistors R0 to R7. This decreases the number of gates configuring the gray scale selection circuit 27. Further, the switch circuit 31 and the short switches SW1 and SW2 have the functions of a logic switch and the functions of a voltage dividing resistor. This reduces the circuit area in comparison to when the logic switch and the voltage dividing resistor are provided separately. Accordingly, reduction of the chip size of the driver IC 21 is enabled.

(2) The ON resistances of the switch circuit 31 and the short switches SW1 and SW2 are substantially equal to one another. This enables accurate generation of the pixel voltage required for gray scales on the display 11.

(3) The impedances of the switch circuit 31 and the short switches SW1 and SW2 are adjusted to suppress the influence of the offset resistance generated by the gray scale lines.

(4) To test the prior art IC 1 that achieves 256 gray scales, the selection of 256 gray scales must be checked. In comparison, the driver IC 21 requires only the checking of 80 gray scales. This shortens the test time and saves test costs.

(5) In the gray scale selection circuit 27, the switch circuit 31 is activated and inactivated in accordance with the input signals D7 to D2 that correspond to the upper six bits. Further, the short switches SW1 to SW5 are activated and inactivated in accordance with the input signal D2 to D0 that correspond to the lower three bits. This is preferable for selecting the gray scale voltage corresponding to the data values of the input signals D7 to D0.

Figure 2:
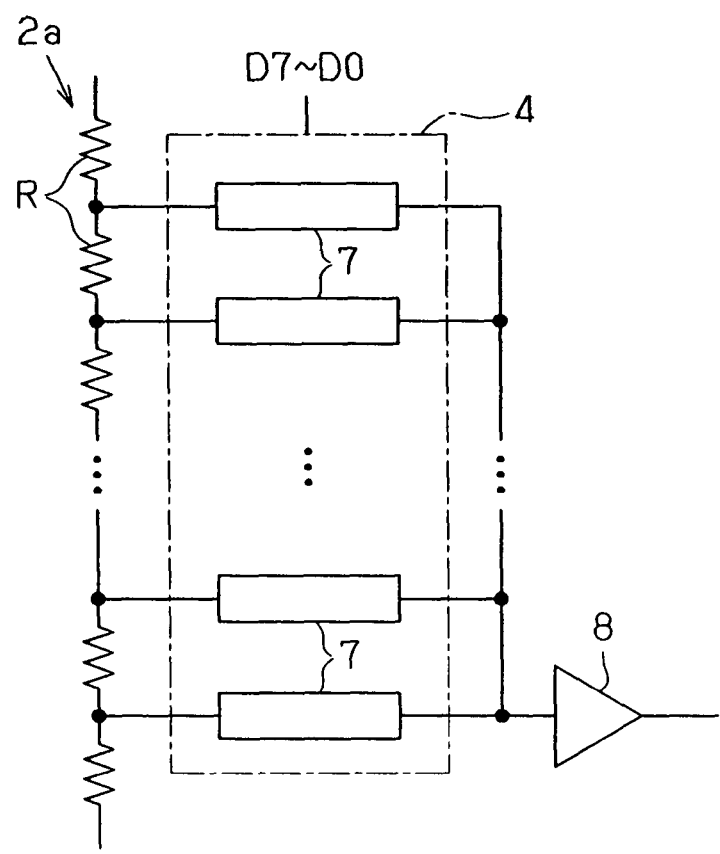
FIG. 2 is a schematic block circuit diagram illustrating part of the driver IC of FIG. 1.
Figure 3:
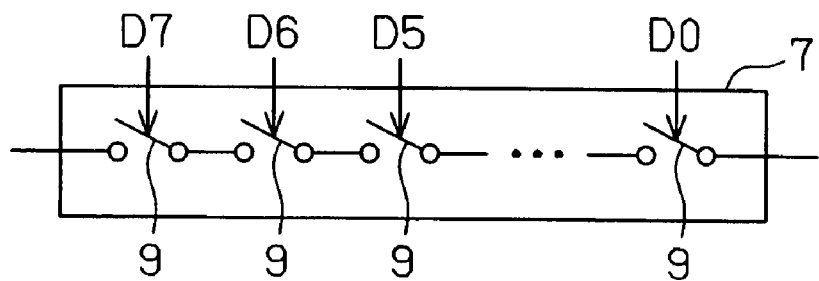
FIG. 3 is a schematic circuit diagram of a switch circuit incorporated in the driver IC of FIG. 1.
Figure 13:
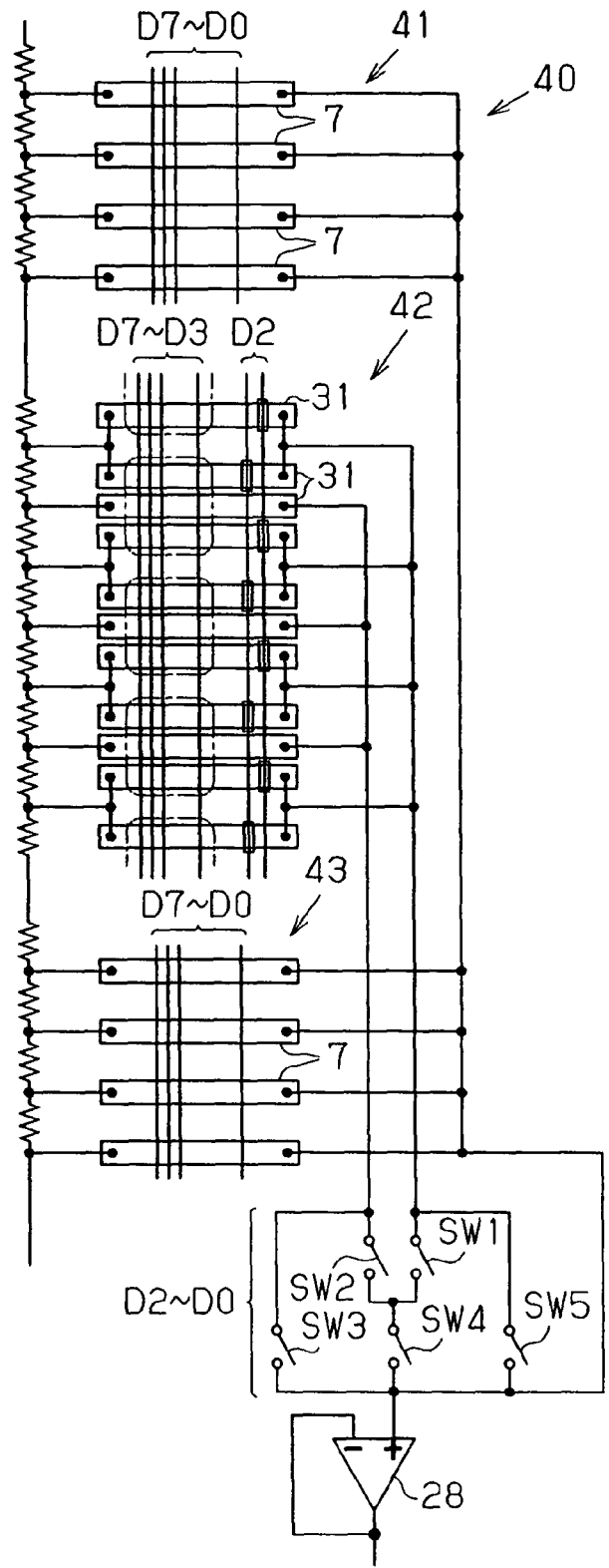
FIG. 13 is a circuit diagram of a gray scale selection circuit according to a second embodiment of the present invention.

FIG. 13 is a schematic circuit diagram of a gray scale selection circuit 40 according to a second embodiment of the present invention. The gray scale selection circuit 40 is configured by combining the prior art gray scale selection circuit 4 of FIG. 2 and the gray scale selection circuit 27 of the first embodiment.

The gray scale selection circuit 40 includes a first selection section 41, a second selection section 42, and a third selection section 43. The second selection section 42 is configured between the first selection section 41 and the third selection section 43.

The circuit configuration of the first and third selection sections 41 and 43 are similar to that of the gray scale selection circuit 4 in the prior art. Further, the circuit configuration of the second selection section 42 is similar to that of the gray scale selection circuit 27 in the first embodiment. The first and third selection sections 41 and 43 include switch circuits 7, each having eight series-connected switches. Further, the first and third selection sections 41 and 43 directly supplies the divisional voltages generated by the ladder resistors to the operational amplifier 28. The second selection section 42 includes switch circuits 31, each having six series-connected switches, and short switches SW1 to SW5. The second selection section 42 divides the divisional voltages generated by the ladder resistors and supplies the divided voltages to the operational amplifier 28.

The divisional voltages generated by the ladder resistors and supplied to each switch circuit 7 of the first and third selection sections 41 and 43 correspond to the 256 gray scales. The divisional voltage of the ladder resistors supplied to the switch circuits 31 of the second selection section 42 corresponds to the 64 gray scales.

The divisional voltages generated by the ladder resistors and supplied to the switch circuit 7 of the first and third selection sections 41 and 43 correspond to 256 gray scales. The divisional voltages generated by the ladder resistors and supplied to each switch circuit 31 of the second selection section 42 correspond to 64 gray scales.

In the second selection section 42, voltage dividing circuits configured by the switch circuits 31 and the short switches SW1 and SW2 generate median voltages for four gray scales. The switch circuits 31 and the short switches SW1 and SW2 are configured so that their impedances are substantially the same.

To accurately generate median voltages for four gray scales with a configuration in which 240 gray scale selection circuits are connected parallel to one ladder resistor, the ratio of the sum of the impedances of the switch circuits 31 and the switches SW1 and SW2 relative to the impedances of the ladder resistors must be about 2400:1 ((240×10):1). Accordingly, in the second embodiment, the first and third selection sections 41 and 43 having the prior art circuit configurations are used in a range in which the ratio of the impedances increases and median voltages corresponding to 256 gray scales cannot be generated by the voltage dividing circuit.

The gray scale selection circuit 40 of the second embodiment has the advantages described below.

(1) The gray scale selection circuit 40 includes the second selection section 42, which has the same circuit configuration as that of the gray scale selection circuit 27 in the first embodiment. Thus, the number of gates is decreased in comparison to the gray scale selection circuit 4 of the prior art. The gray scale selection circuit 40 enables the chip size of the driver IC 21 to be reduced.

(2) The gray scale selection circuit 40 includes the second selection section 42, the circuit configuration of which is similar to that of the gray scale selection circuit 27 in the first embodiment, and the first and third selection sections 41 and 43, the circuit configurations of which are similar to that of the gray scale selection circuit 4 in the prior art. Thus, the gray scale voltages for 256 gray scales are accurately generated.

Figure 14:
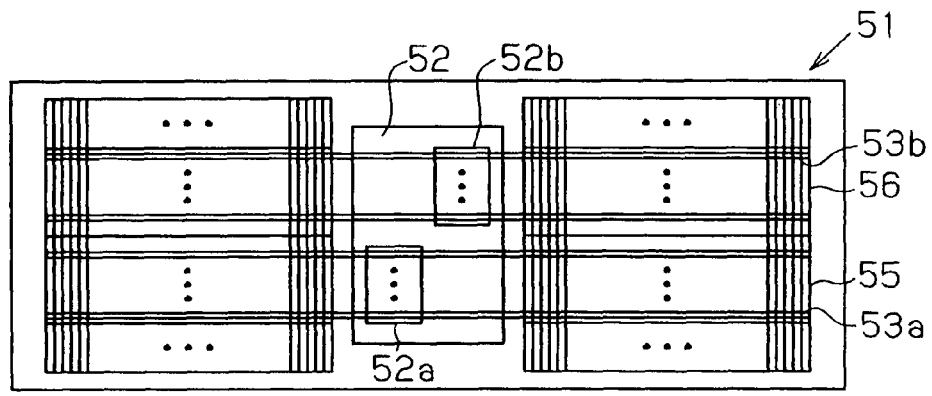
FIG. 14 is a schematic diagram of a driver IC according to a third embodiment of the present invention.

FIG. 14 is a schematic diagram of a driver IC 51 according to a third embodiment of the present invention. To prevent deterioration of liquid crystals in the liquid crystal panel 12, the polarity of the drive voltage (pixel voltage) supplied from the source driver 14 to the pixel cells GC is inverted. The driver IC 51 of the third embodiment includes a circuit for supplying the pixel cells GC with positive voltage and a separate circuit for supplying the pixel cells GC with negative voltage.

More specifically, as shown in FIG. 14, a logic section 52 of the driver IC 51 includes a positive voltage dividing circuit 52a and a negative voltage dividing circuit 52b, which are configured by ladder resistors. The first voltage dividing circuit 52a generates a positive divisional voltage from a common voltage Vcom, and the second voltage dividing circuit 52b generates a negative divisional voltage from the common voltage Vcom. Each ladder resistor of the first voltage dividing circuit 52a is connected to a first selection circuit 55 via a positive gray scale line 53a. Each ladder resistor of the second voltage dividing circuit 52b is connected to a second selection circuit 56 via a negative gray scale line 53b.

Figure 15:
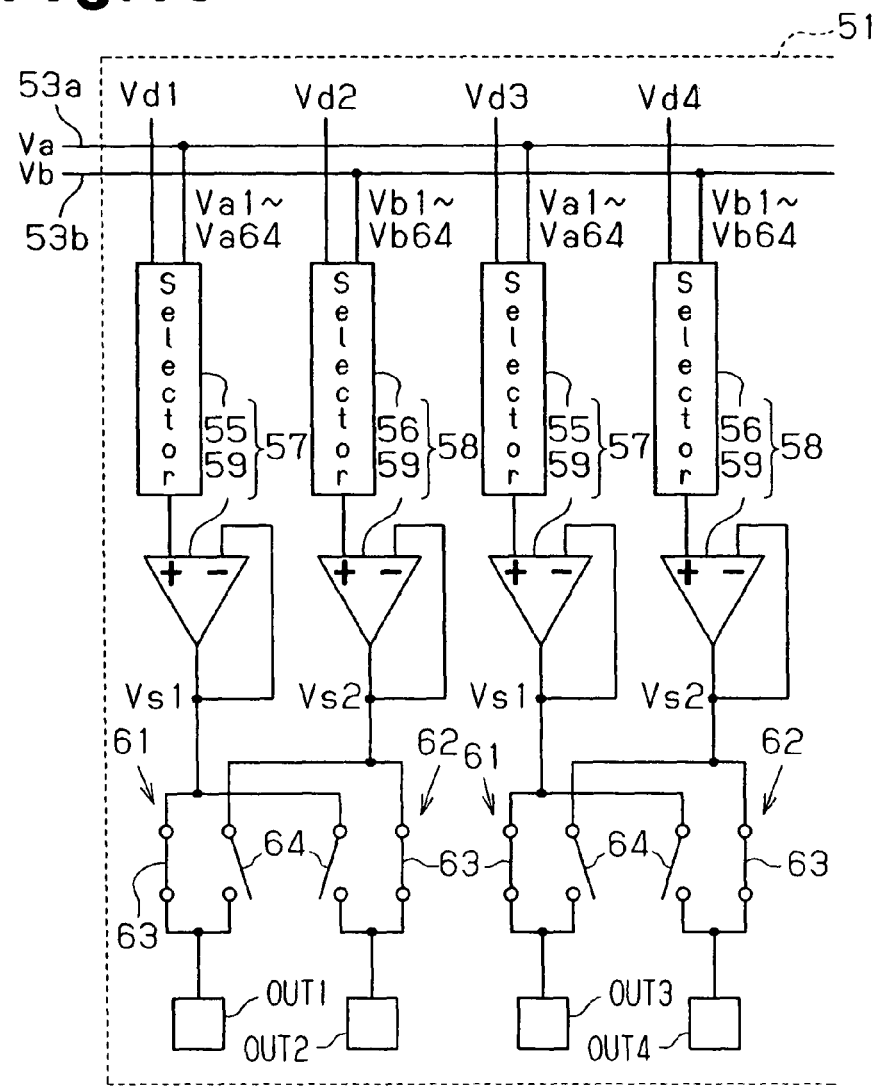
FIG. 15 is a schematic block circuit diagram illustrating part of the driver IC of FIG. 14.

FIG. 15 is a schematic block circuit diagram illustrating part of the driver IC 51. The driver IC 51 includes a plurality of first and second D/A converters 57 and 58. Each first D/A converter 57 includes a first selection circuit (selector) 55 and an operational amplifier 59. Each second D/A converter 58 includes a second selection circuit (selector) 56 and an operational amplifier 59. The circuit configurations of the selectors 55 and 56 are similar to the gray scale selection circuit 27 of the first embodiment.

The selector 55 of each first D/A converter 57 receives first image signals (input signals) Vd1 and Vd3 and first gray scale voltages Va1 to Va64. The selector 56 of each second D/A converter 58 receives second image signals (input signals) Vd2 and Vd4 and second gray scale voltages Vb1 to Vb64. Each of the image signals Vd1 to Vd4 includes eight bits of signals D0 to D7 that are provided by a data latch circuit (not shown).

The first gray scale voltages Va1 to Va64 are positive divisional voltages generated by ladder resistors of the first voltage dividing circuit 52a and provided from the first voltage dividing circuit 52a through the positive gray scale lines 53a. The second gray scale voltages Vb1 to Vb64 are positive divisional voltages generated by ladder resistors of the second voltage dividing circuit 52b and provided from the second voltage dividing circuit 52b through the negative gray scale lines 53b.

The selector 55 of each first D/A converter 57 selects a divisional voltage of the gray scale corresponding to the first image signals Vd1 and Vd3 in accordance with the first gray scale voltages Va1 to Va64 and supplies the selected divisional voltage to the operational amplifier 59. The operational amplifier 59 supplies the selected divisional voltage (pixel voltage) to each pixel cell. In this manner, the first D/A converter 57 generates a pixel voltage (positive voltage) that is greater than the common voltage Vcom from the first image signals Vd1 and Vd3.

The selector 56 of each second D/A converter 58 selects a divisional voltage of the gray scale corresponding to the second image signals Vd2 and Vd4 in accordance with the second gray scale voltages Vb1 to Vb64 and supplies the selected divisional voltage to the operational amplifier 59. The operational amplifier 59 supplies the selected divisional voltage to each pixel cell (GC). In this manner, the second D/A converter 58 generates a pixel voltage (negative voltage) that is less than the common voltage Vcom from the second image signals Vd2 and Vd4.

Polarity switching switches 61 and 62 connect the first and second D/A converters 57 and 58 to output terminals OUT1, OUT2, OUT3, and OUT4. The polarity switching switches 57 and 58 include first and second switches 63 and 64.

The first switches 63 are connected between the output terminal of each first D/A converter 57 and the odd number output terminals OUT1 and OUT2 and between the output terminal of each second D/A converter 58 and the even number output terminals OUT2 and OUT4. The second switches 64 are connected between the output terminal of each first D/A converter 57 and the even number output terminals OUT2 and OUT4 and between the output terminal of each second D/A converter 58 and the odd number output terminals OUT1 and OUT 3.

A polarity switching signal activates and inactivates the first and second switches 63 and 64 every horizontal scan period in a complementary manner. As a result, the polarity switching switches 61 and 62 supply each of the output terminals OUT1 to OUT 4 alternately with positive pixel voltage and negative pixel voltage every horizontal scan period.

In the third embodiment, it is preferred that the selector 55 of each first D/A converter 57, which outputs the positive pixel voltage, be configured only by p-channel MOS transistors. Further, it is preferred that the selector 56 of each second D/A converter 58, which outputs the negative pixel voltage, be configured only by n-channel MOS transistors.

The driver IC 51 of the third embodiment has the advantages described below.

Each of the selectors (selection circuits) 55 and 56 is configured by a dynamic circuit of which voltage dividing circuit is provided with a switch logic circuit function and a voltage dividing resistor. Accordingly, in comparison to when using a selection circuit that achieves these functions by combining a typical CMOS logic circuit and a voltage dividing circuit, the circuit scale may be reduced.

It should be apparent to those skilled in the art that the present invention may be embodied in many other specific forms without departing from the spirit or scope of the invention. Particularly, it should be understood that the present invention may be embodied in the following forms.

The impedances of the switch circuit 31 and the short switches SW1 and SW2 may be adjusted to suppress the influence of ON resistances on the gray scale lines. The impedances of the short switches SW1 and SW2 include, for example, a capacitance component, an inductance component, and a combination of the capacitor component, the inductance component, and the ON resistance of the short switches SW1 and SW2.

The driver IC 21, the gray scale selection circuit 40, and the driver IC 51 may be applied to any display that enables the display of gray scales, such as a field emitting display (FED) or a surface-conduction electron emitting display (SED) that uses a driver IC incorporating a D/A converter.

In the gray scale selection circuits 27, 27a, and 40, the divisional voltages generated by the ladder resistors may be divided into, for example, two or eight.

In each of the above embodiments, the voltage dividing circuit may be configured by, for example, a plurality of capacitors. In this case, the driver IC includes a capacitance dividing type D/A converter. The gray scale selection circuit may be divided into different numbers of selection sections.

The present examples and embodiments are to be considered as illustrative and not restrictive, and the invention is not to be limited to the details given herein, but may be modified within the scope and equivalence of the appended claims.

What is claimed is:

1. A driver IC for a display, the driver IC comprising:
a first D/A converter including a first selection circuit which receives first image signals and supplies a selected positive divisional voltage of gray scale in accordance with the first image signals, and a first operational amplifier which receives the selected positive divisional voltage and supplies a positive pixel voltage by amplifying the selected positive divisional voltage;
a second D/A converter including a second selection circuit which receives second image signals and supplies a selected negative divisional voltage of gray scale in accordance with the second image signals, and a second operational amplifier which receives the selected negative divisional voltage and supplies a negative pixel voltage by amplifying the selected negative divisional voltage; and
a polarity switching switch including first and second switches connecting the first and second D/A converter respectively, the polarity switching switch being switched to supply each of output terminals corresponding to the first image signals and second image signals alternately with the positive pixel voltage and the negative pixel voltage every horizontal scan period by activating and inactivating the first and second switches in a complementary manner,
wherein the first selection circuit includes a plurality of first switch circuits that are selectively activated in accordance with the first image signals to select one of a plurality of positive divisional voltages, each of the plurality of first switch circuits is provided with a logic switch function and has an ON resistance when activated, and the first selection circuit generates the selected positive divisional voltage by further dividing the selected one of the plurality of positive divisional voltages.

2. The driver IC according to claim 1, further comprising:
a positive voltage dividing circuit which generates the plurality of positive divisional voltages by dividing a predetermined positive reference voltage.

3. The driver IC according to claim 1, wherein the plurality of first switch circuits are p-channel MOS transistors connected to the positive voltage dividing circuit.

4. A driver IC for a display, the driver IC comprising:
a first D/A converter including a first selection circuit which receives first image signals and supplies a selected positive divisional voltage of gray scale in accordance with the first image signals, and a first operational amplifier which receives the selected positive divisional voltage and supplies a positive pixel voltage by amplifying the selected positive divisional voltage;
a second D/A converter including a second selection circuit which receives second image signals and supplies a selected negative divisional voltage of gray scale in accordance with the second image signals, and a second operational amplifier which receives the selected negative divisional voltage and supplies a negative pixel voltage by amplifying the selected negative divisional voltage;
a polarity switching switch including first and second switches connecting the first and second D/A converter respectively, the polarity switching switch being switched to supply each of output terminals corresponding to the first image signals and second image signals alternately with the positive pixel voltage and the negative pixel voltage every horizontal scan period by activating and inactivating the first and second switches in a complementary manner,
wherein the first selection circuit includes a plurality of first switch circuits that are selectively activated in accordance with the first image signals to select one of a plurality of positive divisional voltages, each of the plurality of first switch circuits is provided with a logic switch function and has an ON resistance when activated, and the first selection circuit generates the selected positive divisional voltage by further dividing the selected one of the plurality of positive divisional voltages; and
a positive voltage dividing circuit which generates the plurality of positive divisional voltages by dividing a predetermined positive reference voltage,
wherein the positive voltage dividing circuit includes a plurality of series-connected ladder resistors which generates the plurality of positive divisional voltages from the predetermined positive reference voltage, and an activated one of the first switch circuits is connected in parallel to one of the ladder resistors.

5. The driver IC according to claim 4, wherein more than one of the first switch circuits are activated and connected in series to one another.

6. The driver IC according to claim 4, wherein the first switch circuits are configured that ON resistances of the first switch circuits have substantially the same value.

7. The driver IC according to claim 4, further comprising:
a third D/A converter which is configured as well as the first D/A converter,
wherein the positive voltage dividing circuit is connected to the selection circuits in each of the first and third D/A converters, the plurality of positive divisional voltages are supplied to each of the selection circuits, the plurality of first switch circuits in each of the first and third D/A converters has an impedance that is adjusted in accordance with the distance from the positive voltage dividing circuit.

8. A display comprising:
a liquid crystal panel;
a plurality of gate lines;
a plurality of source lines;
a gate drive circuit connected to the gate lines;
a source drive circuit connected to the source lines having
a first D/A converter including a first selection circuit which receives first image signals and supplies a selected positive divisional voltage of gray scale in accordance with the first image signals, and a first operational amplifier which receives the selected positive divisional voltage and supplies a positive pixel voltage by amplifying the selected positive divisional voltage, and a second D/A converter including a second selection circuit which receives second image signals and supplies a selected negative divisional voltage of gray scale in accordance with the second image signals, and a second operational amplifier which receives the selected negative divisional voltage and supplies a negative pixel voltage by amplifying the selected negative divisional voltage; and
a polarity switching switch including first and second switches connecting the first and second D/A converter respectively, the polarity switching switch being switched to supply each of output terminals corresponding to the first image signals and second image signals alternately with the positive pixel voltage and the negative pixel voltage every horizontal scan period by activating and inactivating the first and second switches in a complementary manner,
wherein the first selection circuit includes a plurality of first switch circuits that are selectively activated in accordance with the first image signals to select one of a plurality of positive divisional voltages, each of the plurality of first switch circuits is provided with a logic switch function and has an ON resistance when activated, and the first selection circuit generates the selected positive divisional voltage by further dividing the selected one of the plurality of positive divisional voltages.

9. The display according to claim 8, further comprising:
a positive voltage dividing circuit which generates the plurality of positive divisional voltages by dividing a predetermined positive reference voltage.

10. The display according to claim 8, wherein the plurality of first switch circuits are p-channel MOS transistors connected to the positive voltage dividing circuit.

11. The display according to claim 8, wherein the display is a liquid crystal display.

12. A display comprising:
a liquid crystal panel;
a plurality of gate lines;
a plurality of source lines;
a gate drive circuit connected to the gate lines;
a source drive circuit connected to the source lines having
a first D/A converter including a first selection circuit which receives first image signals and supplies a selected positive divisional voltage of gray scale in accordance with the first image signals, and a first operational amplifier which receives the selected positive divisional voltage and supplies a positive pixel voltage by amplifying the selected positive divisional voltage, and a second D/A converter including a second selection circuit which receives second image signals and supplies a selected negative divisional voltage of gray scale in accordance with the second image signals, and a second operational amplifier which receives the selected negative divisional voltage and supplies a negative pixel voltage by amplifying the selected negative divisional voltage;
a polarity switching switch including first and second switches connecting the first and second D/A converter respectively, the polarity switching switch being switched to supply each of output terminals corresponding to the first image signals and second image signals alternately with the positive pixel voltage and the negative pixel voltage every horizontal scan period by activating and inactivating the first and second switches in a complementary manner,
wherein the first selection circuit includes a plurality of first switch circuits that are selectively activated in accordance with the first image signals to select one of a plurality of positive divisional voltages, each of the plurality of first switch circuits is provided with a logic switch function and has an ON resistance when activated, and the first selection circuit generates the selected positive divisional voltage by further dividing the selected one of the plurality of positive divisional voltages; and
a positive voltage dividing circuit which generates the plurality of positive divisional voltages by dividing a predetermined positive reference voltage,
wherein the positive voltage dividing circuit includes a plurality of series-connected ladder resistors which generate the plurality of positive divisional voltages from the predetermined positive reference voltage, and an activated one of the first switch circuits is connected in parallel to one of the ladder resistors.

13. The display according to claim 12, wherein more than one of the first switch circuits are activated and connected in series to one another.

14. The display according to claim 12, wherein the first switch circuits are configured such that ON resistances of the first switch circuits have substantially the same value.

15. The display according to claim 12, further comprising:
a third D/A converter which is configured as well as the first D/A converter,
wherein the positive voltage dividing circuit is connected to the selection circuits in each of the first and third D/A converters, the plurality of positive divisional voltages are supplied to each of to the selection circuits, the plurality of first switch circuits in each of the first and third D/A converters has an impedance that is adjusted in accordance with the distance from the positive voltage dividing circuit.

* * * * *